United States Patent [19]

LePoole et al.

[11] 4,095,104

[45] June 13, 1978

[54] ELECTRON MICROSCOPE

[75] Inventors: Jan Bart LePoole, Delft; Karel Diederick van der Mast, Eindhoven, both of Netherlands

[73] Assignee: U.S. Philips Corporation, New York, N.Y.

[21] Appl. No.: 717,193

[22] Filed: Aug. 24, 1976

[51] Int. Cl.² ............................................. H01J 37/26
[52] U.S. Cl. .................................................. 250/311
[58] Field of Search ...................... 250/311, 396, 398

[56] References Cited

U.S. PATENT DOCUMENTS

| | | | |
|---|---|---|---|
| 3,644,733 | 2/1972 | Krahl | 250/311 |
| 3,786,271 | 1/1974 | Joy et al. | 250/398 |
| 3,914,608 | 10/1975 | Malmberg | 250/311 |
| 3,997,807 | 12/1976 | Riddle et al. | 250/311 |

Primary Examiner—Bruce C. Anderson
Attorney, Agent, or Firm—Frank R. Trifari

[57] ABSTRACT

In an electron microscope having a comparatively high resolution, a tilting motion about a point in an object to be imaged is imparted to the illuminating electron beam in order to adjust the coherence of the exposure of an object. For the exposure aperture, the aperture given by the degree of deflection then takes the place of the very small aperture of the illuminating electron beam. A preferred embodiment includes a correction device for the non-axial passage of the electron beam through a subsequent lens in the electron microscope. Operation with a conical exposure involving a present apex is also feasible.

7 Claims, 1 Drawing Figure

U.S. Patent　　　June 13, 1978　　　4,095,104
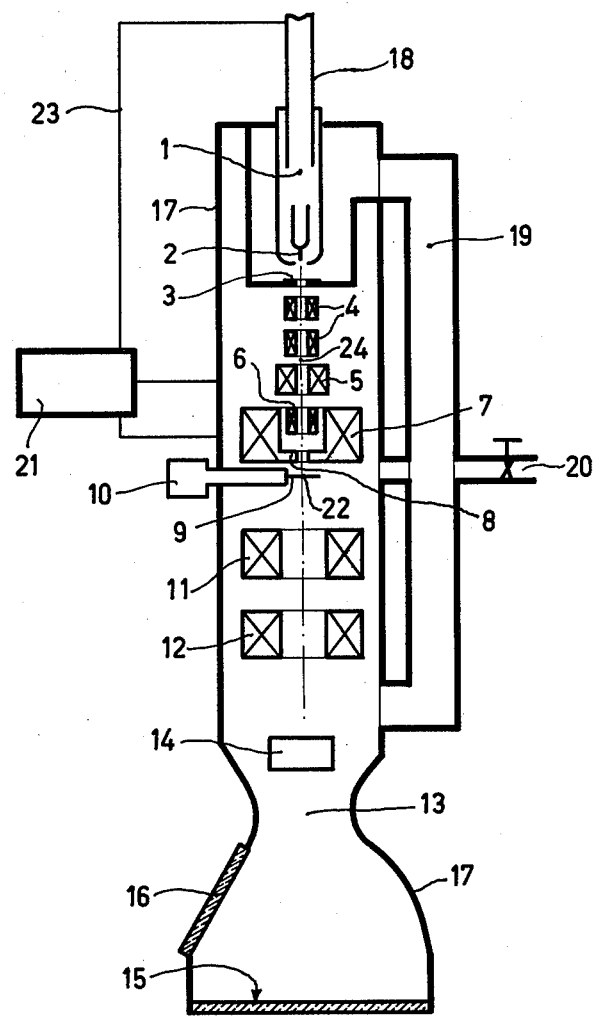

ELECTRON MICROSCOPE

The invention relates to an electron microscope, comprising an electron gun for generating an illuminating electron beam and a device for the apparent enlargement of the aperture of the illuminating electron beam.

Electron microscopes, notably high-resolution types, have a drawback in that, due to the comparatively small aperture of the illuminating electron beam, the depth of focus of the image is so large that exact adjustment of an image plane is impeded thereby.

British Patent Specification No. 687,207 describes an electron microscope in which it is attempted to eliminate this drawback by superposing an alternating image having a comparatively high frequency on the focussing field of the condenser lens. The focal point of the condenser lens is then displaced over a given trajectory along the optical axis of the electron microscope. This results in a variable object distance for the objective lens, a varying aperture for the illuminating electron beam thus being realized, so that optimum focus can be more readily adjusted. However, this is accompanied by an additional contribution to spherical aberation, a restriction in the freedom of choice of the exposure intensity in the object, and a variation of the real beam aperture across the object. Due to the varying brightness in the image, this method cannot be used for making recordings.

The invention has for its object to provide an electron microscope in which a comparatively large apparent aperture can be realized without giving rise to the said drawbacks. To this end, an electron microscope of the kind set forth according to the invention is characterized in that the device for the apparent enlargement of the aperture comprises a beam deflection device which includes a power supply source for tilting the illuminating electron beam about a point situated in an object plane.

In an electron microscope in accordance with the invention, the beam current is not at all influenced by introducing a quasi large aperture, because the transverse dimension of the electron beam remains constant in the object plane, and no axial shift of the object point in the illuminating beam occurs. Viewed in the transverse direction, an object of the illuminating beam describes a rather arbitrary figure about the optical axis. The transverse dimensions of this figure as well as the registration in the figure can be chosen substantially at random, provided that the tilting point is always situated in the object plane. Because no defocussing of the beam occurs, the illumination intensity in the image plane is constant, and the desired apparent coherence increase of the illuminating beam can also be used during the making or studying of recordings. In a preferred embodiment it is possible, for the non-axial passing of the electron beam through the objective lens, to apply a given correction, coupled to the degree of transverse displacement of the beam, to the excitation of the relevant lens.

Some preferred embodiments of an electron microscope in accordance with the invention will be described in detail hereinafter with reference to the drawing. The drawing diagrammatically shows an electron microscope comprising an electron gun 1 which preferably comprises a field emission source 2 for generating an electron beam having a comparatively high density or a comparatively small cross-section. Opposite the emission source 2 there is arranged an anode 3 and, proceeding in the direction of the electron beam, a succession of a beam alignment device 4, a condenser lens 5, a beam wobbler 6, an objective lens 7 comprising pole shoes 8, an object 9 comprising an object adjustment device 10, an intermediate lens 11, and a projection lens 12. An image space 13 of the electron microscope accommodates a camera 14 and a phosphor screen 15 which can be observed through a window 16. All electron-optical elements are accommodated in a housing 17 which comprises, besides the window 16, a passage 18 for applying the necessary potentials and vacuum duct 19, comprising a connection 20 for a pumping device 20.

A power supply source 21 for the wobbler is constructed in accordance with the invention so that a tilting movement about a point 22 in the object can be imparted to an electron beam. The power supply source is preferably also controlled by the high voltage to be applied; this is diagrammatically shown by way of the connection line 23.

A beam wobbler usually comprises two sets of electromagnetic coils whereby an electron beam is first deflected in known manner from the optical axis 24 and subsequently deflected again to a given point on the optical axis. The latter point on the optical axis is referred to as the tilting point in which the beam is incident from all directions within a conical circumference. A base plane of this cone is or is not scanned by the beam; consequently, viewed in the time, the beam can describe only the conical surface or fill the entire cone. The base surface of the cone may have any shape. For reasons of symmetry, a circle or a rectangle is preferably used as the base. Notably in the case of a circle, the beam can then describe a helix, for example, by utilizing power supply by means of two sine wave generators, powered slightly out of phase, while in the case of a rectangle, the movement of the beam is that of a scanning beam, as in a television system, by way of a corresponding power supply.

If the wobbler is actuated in this manner, the object is exposed, measured in the time, with an aperture which is given by the apex of the cone and which, obviously, may amount to as much as, for example, 1000 times the aperture of the electron beam itself.

During this beam deflection, the beam current is not influenced and the object point is not shifted in the axial direction for the exposure. Like in the said British Patent Specification No. 687,207, correction for spherical aberration is also possible. To this end, it is merely necessary in an electron microscope in accordance with the invention to control the appropriate lens, in this case, for example, the objective lens, in dependence of the radial position of the electron beam. Contrary to the correction in the known electron microscope, the beam in the electron microscope in accordance with the invention is not wider, but only does not pass paraxially through the lens. On the basis of a paraxial beam path of the non-deflected electron beam, the spherical aberration which would occur due to the deflection can thus be fully compensated for. As a result of the addition of an adjustable control member for the power supply of the deflection device, a preferred embodiment of an electron microscope in accordance with the invention enables operation with a conical exposure with a presettable apex or series of apexes. Exposure is also possible from a fixed point or a series of fixed points outside the optical axis. As result, the nature of the exposure can be adapted, for example, to special properties of the object to be examined.

What is claimed is:

1. An electron microscope, comprising an electron gun for generating an illuminating electron beam objective lens means directing said beam to an object plane, projection lens means directing said beam from said object plane to an image plane, and a device for the apparent enlargement of the aperture of the illuminating electron beam, characterized in that the device for the apparent enlargement of the aperture comprises a beam deflection device which includes a power supply source for tilting the illumination electron beam about a point situated in said object plane.

2. An electron beam apparatus as claimed in claim 1, characterized in that the electron gun comprises a field-emission source.

3. An electron microscope as claimed in claim 1, characterized in that the power supply source for the deflection device comprises means for helically deflecting the illuminating electron beam.

4. An electron microscope as claimed in claim 1, characterized in that the power supply source for the deflection device comprises means for grid-like deflection of the illuminating electron beam.

5. An electron microscope as claimed in claim 1, characterized in that the power supply source for the beam deflection device comprises a control member for exposing the object from fixed, presettable directions.

6. An electron microscope as claimed in claim 5, characterized in that the control member is adapted to realize a conical exposure with a presettable apex or series of successive apexes.

7. An electron microscope as claimed in claim 1 comprising a correction device controlled by the radial deflection of the electron beam and which serves for a subsequent electron-optical lens.

* * * * *

UNITED STATES PATENT AND TRADEMARK OFFICE
CERTIFICATE OF CORRECTION

PATENT NO. : 4,095,104
DATED : June 13, 1978
INVENTOR(S) : JAN B. LE POOLE ET AL It is certified that error appears in the above-identified patent and that said Letters Patent are hereby corrected as shown below:

In the Title Page:

Insert --Foreign Application Priority Data

The Netherlands   Application No. 7510276
Filed   September 1, 1975--

Signed and Sealed this

Nineteenth Day of February 1980

[SEAL]

Attest:

SIDNEY A. DIAMOND

Attesting Officer   Commissioner of Patents and Trademarks